United States Patent [19]

Fasbender et al.

[11] Patent Number: 5,393,591
[45] Date of Patent: Feb. 28, 1995

[54] PROCESS FOR PRODUCING COPPER-CLAD BASE MATERIALS

[75] Inventors: Helmut Fasbender, Berg.-Gladbach; Burkhard Voss, Pulheim, both of Germany

[73] Assignee: Huls Troisdorf Aktiengesellschaft, Troisdorf, Germany

[21] Appl. No.: 64,027

[22] PCT Filed: Nov. 11, 1991

[86] PCT No.: PCT/EP91/02130
§ 371 Date: May 19, 1993
§ 102(e) Date: May 19, 1993

[87] PCT Pub. No.: WO92/09186
PCT Pub. Date: May 29, 1992

[30] Foreign Application Priority Data

Nov. 19, 1990 [DE] Germany ............... 4036802

[51] Int. Cl.⁶ ............................................. B32B 9/00
[52] U.S. Cl. ................................. 428/209; 428/105; 428/297
[58] Field of Search ................... 428/209, 107

[56] References Cited

U.S. PATENT DOCUMENTS

| | | | |
|---|---|---|---|
| 4,401,499 | 8/1983 | Kaneko et al. | 156/307.3 |
| 4,609,586 | 9/1986 | Jensen et al. | 428/209 |
| 4,788,224 | 11/1988 | Müller et al. | 528/48 |
| 4,943,334 | 7/1990 | Medney et al. | 156/174 |

*Primary Examiner*—Patrick J. Ryan
*Assistant Examiner*—Kam F. Lee
*Attorney, Agent, or Firm*—Millen, White, Zelano & Branigan

[57] ABSTRACT

In a process known per se for producing base materials copper-clad on at least one side, in which a winding core carrying a copper foil is wound with a reinforcing fiber, the laid fibers are impregnated with a solvent-free resin and the resin is cured fully to reach the C-stage, it is proposed to use, as the resin, a solvent-free epoxy-isocyanurate resin having a viscosity at processing temperature of less than 1000 mPa.s and an NCO content of more than 20%.

16 Claims, No Drawings

PROCESS FOR PRODUCING COPPER-CLAD BASE MATERIALS

TECHNICAL FIELD

The invention relates to a process for producing copper-clad base materials and to a process for producing multilayers from these base materials.

Base materials (circuit boards) are boards copper-clad on one or both sides, consisting generally of fiber-reinforced thermosetting resins, the resin being in the C-stage. They are used for the manufacture of printed circuit boards for the electronics industry and, if appropriate, for further processing into multilayers.

Multilayers are laminates consisting of a plurality of base materials. For producing them, the base materials (resin in the C-stage), provided with appropriate conductive patterns, are pressed with interposed (adhesive) prepregs (resin in the B-stage) with application of pressure and heat, the resin of the prepregs curing fully to reach the C-stage.

Prepregs are resin-impregnated substrates, in general sheets of glass fiber fabric, the resin being in the not yet completely cured (B) state.

A conventional process for producing copper-clad base materials is the pressing of a plurality of plies of prepreg cut sheets with covering plies of copper foil with application of pressure and heat, the resin of the prepregs being cured fully to reach the C-stage.

BACKGROUND ART

WO 88/01,938 has disclosed a process of the generic type for producing base materials copper-clad on one or both sides by the so-called filament-winding technique and the use thereof for producing multilayers. In this process, the winding mandrel used is a steel sheet covered with a copper foil. This sheet is wound at the smallest possible inclination with one ply of yarn filaments of a reinforcing material, preferably alkali-free glass, initially across the width, with the winding mandrel rotating. After the whole surface of the sheet has been wound, this winding step is repeated at an angle of -90°, whereby a second ply is applied. The step of crosswise winding is repeated several times until the desired glass content or the desired thickness of the wound plies has been reached. Instead of the conventional fabric reinforcement, a laid fiber structure is thus formed, in which the individual filaments are not woven with one another but lie loosely on top of one another.

After completion of the winding step, a closed mold is formed by means of two metal sheets, covered on the inside with copper foil, and lateral sealing webs, which mold is evacuated to a residual pressure of less than 2 mm Hg. In an injection process or casting process, which is known to those skilled in the art, for example, as the RTM process (resin transfer molding), a prepared and, if appropriate, heated resin mixture is then allowed to flow in and, after the filling step has been completed, the resin mixture is allowed to cure fully at elevated temperature.

The casting resin mixture, described in WO 88/01,938, of epoxide resin and anhydride hardening agent has, however, a poor adhesion between copper and the plies, since a hardening agent must be added in relatively large quantities, and this impairs the adhesive force (peel strength).

In particular in the case of base material with a thin copper foil, for example 17.5 /um thickness, whose use is indispensable for fine line technology and very fine line technology, the peel strength drops down to 1.0N/mm and lower, so that the requisite values are not reached.

OBJECT

It is therefore the object of the invention to provide a process of the generic type for producing base materials, which process leads to boards having higher peel strength of the copper foil and improved bonding of the plies.

A further objective of the invention is to provide an improved process for producing multilayers, using base materials produced by the filament-winding process (WO 88/01,938).

DISCLOSURE OF THE INVENTION

According to the invention, a process for producing base materials copper-clad on at least one side, comprising (a) winding reinforcing fiber on a winding core carrying a copper foil, (b) impregnating the wound fibers with a solvent-free resin, and (c) curing the resin, the improvement comprising employing a solvent-free epoxy-isocyanurate resin having a viscosity at processing temperature of less than 1000 mPa.s according to DIN 53015, preferably less than 500 mPa.s, and an NCO content of more than 20%.

Surprisingly, it has been found that very high copper adhesion forces (peel strength)—typically between 1.6 and 1.8 N/mm—are achieved by the process according to the invention. The adhesion of the copper depends here to a certain extent on the NCO content of the resin, higher NCO contents leading to improved copper adhesion.

The epoxy-isocyanurate resin is preferably prepared from diphenylmethane diisocyanate, a bisphenol A-based epoxide resin (diglycidyl ether of bisphenol A, epoxide number 0.585) and a suitable catalyst, for example dimethylbenzylamine (EP-A2-0,272,563).

According to a first embodiment of the invention, after mixing, the said components are used directly for impregnating or soaking the laid fibers, corresponding to WO 88/01,838. The resin is then fully cured in an advantageously evacuated mold at a temperature of 100° C. to 150° C. (to reach the C-stage).

Advantageously, however, an at least partially (incipiently) reacted resin system of the abovementioned components is used, which can be adjusted to an appropriate viscosity and NCO content by addition of a stopper solution according to EP-A2-0,272,563. Before the impregnation or drying of the laid fibers, an appropriate catalyst, for example as described in EP-A2-0,272,563, must be added to the resin.

For preparing, according to the invention, the (adhesive) prepregs required for the multilayers, an epoxy-isocyanurate resin is likewise used, but a resin having a higher viscosity and a lower NCO content. The resin used for this purpose has already reacted to a relatively great extent and is thus solid at room temperature. The NCO content is less than 17%, preferably less than 14%. The impregnation of the prepreg substrates, preferably commercially available glass fabric webs of alkali-free glass, is carried out either by means of a solution of the resin or by impregnation, preferably in vacuo, with a resin liquefied by heating. The solution or the heated resin contains in this case a latent catalyst which, on later heating of the prepreg, starts the further reaction of the resin to reach the C-stage.

The resins used can be the epoxy-isocyanurate resins or solutions corresponding to EP-A2-0,272,563, for example according to Example 2 or Example 3. The resin content of the prepregs is preferably 35–65% by weight, especially 40–50% by weight.

For producing the multilayers, printed circuits are first etched in a manner known per se out of the copper-clad base materials. These are superposed, each separated by an adhesive prepreg, and pressed in a manner known per se with application of pressure and heat to give the multilayers, the resin of the prepregs curing fully to reach the C-stage.

A particular advantage of the process according to the invention is that a resin of the same type can be used for the preparation of both the base materials and the adhesive prepregs, even though the resin for the base materials must be fully cured directly to reach the C-stage, whereas the resin for the prepregs must be kept in the B-stage for storage stability. If appropriate, however, commercially available prepregs based on epoxide resins can also be used as the prepregs.

BEST MODE FOR CARRYING OUT THE INVENTION

In an illustrative example for producing multilayers, a solvent-free polyisocyanurate reactive resin based on diphenylmethane diisocyanate and a bisphenol A-based epoxide resin, having a viscosity of 300 mPa.s at 25° C. and an NCO content of 25% (mixture of in each case 50 parts by weight of the trial products Blendur$^R$ I KU 3-4516 and Blendur$^R$ I KU 3-4520 made by Bayer AG) is prepared and catalyzed with 2 parts by weight of an addition product of boron trichloride and dimethyloctylamine (made by Ciba Geigy). The mixture is introduced into a mold which is preheated to 50° C. and which is wound crosswise with 4 plies of glass yarn of ES 9-680 dtex on a sheet metal core, as described in WO 88/01,838, and covered on the inner surfaces with a 35/um thick foil of electrolyte copper. After curing for 2 hours at 200° C., the board is released from the mold. The measured property data exceed the values set by DIN/IEC-249 for hard epoxide/glass fabrics of type FR-4, values of between 1.6 and 1.8 N/mm having been measured for the copper peel strength.

The following were also determined: the glass transition temperature Tg was 280° C.; the dimensional stability in both spatial directions was 100–110 ppm in each case and the flammability rating according to UL-94 was V1.

To prepare the adhesive prepregs, a polyisocyanurate resin solid at room temperature (Tg=40° C.) based on diphenylmethane diisocyanate and on a bisphenol A-based epoxide resin, having an NCO content of 13% (commercial product Blendur I KU 3-4521, made by Bayer AG) is dissolved in methyl ethyl ketone as the solvent. 2% of an addition product of boron trichloride and dimethyloctylamine (made by Ciba Geigy) is added as a catalyst to the solution. A glass fabric (US style 7628) is then impregnated with the 62% solution in a vertical impregnating machine at a maximum dry shaft temperature of 150° C. in such a way that a resin content of 45% by weight is reached. The prepreg thus obtained, the resin of which has a residual content of 13% by weight of NCO groups, is sealed airtight and moisture-tight in polyethylene film and is thus storage-stable.

From the board obtained in the first process step, a two-sided circuit is produced by the conventional print-and-etch process, this is subjected to the likewise conventional black oxidation process with commercially available oxidizers, 2 sheets of the prepreg obtained in the second process step and 1 sheet of 35 /um thick foil of electrolyte copper are then laid around each of the two sides and, finally, the whole is laminated in a press for 2 hours at 180° C. between 2 steel sheets and conventional press pads. After heat treatment of the finished board for 2 hours at 200° C., it is further processed in the conventional manner to give a 4-ply multilayer.

We claim:

1. In a process for producing base materials copper-clad on at least one side, comprising:
   (a) winding reinforcing fibers on a winding core carrying a copper foil,
   (b) impregnating the resultant wound fibers with a solvent-free resin, and
   (c) curing the resin fully, the improvement comprising employing as the resin a solvent-free epoxy-isocyanurate resin having a viscosity at processing temperature of less than 1000 mPa.s and an NCO content of more than 20%.

2. A process according to claim 1, wherein the resin is an epoxy-isocyanurate resin produced from diphenylmethane diisocyanate and a bisphenol A epoxide resin and a catalyst.

3. In a process for producing multilayers, comprising compacting a plurality of base materials with interposed prepegs with application of pressure and heat, the improvement comprising producing said base materials by a process comprising winding reinforcing fiber on a winding core carrying a copper foil, impregnating the resultant wound fibers with a solvent-free epoxy-isocyanurate resin having a viscosity at processing temperature of less than 1000 mPa.s and an NCO content of more than 20% and wherein the resin for said prepegs is an epoxy-isocyanurate resin in the A state or B-stage, which is solid at room temperature and has an NCO content of less than 17%.

4. A circuit board having a copper foil surface reinforced by glass fibers impregnated with an epoxy-isocyanurate resin having an NCO content of more than 20%.

5. A circuit board according to claim 4, wherein said copper foil has a peel strength of 1.6–1.8 N/mm.

6. A multilayer comprising a plurality of layers having a copper foil surface reinforced by glass fibers impregnated with an epoxy-isocyanurate resin having an NCO content of more than 20%, said layers being joined by an epoxy-isocyanurate resin prepeg having an NCO content of less than 17%.

7. An article produced by the process of claim 1.

8. An article produced by the process of claim 2.

9. An article produced by the process of claim 3.

10. A process according to claim 1, wherein the copper foil has a thickness of not more than 35 μm.

11. A process according to claim 3, wherein the copper foil has a thickness of not more than 35 μm.

12. A circuit board according to claim 5, wherein the copper foil has a thickness of not more than 35 μm.

13. A multilayer according to claim 6, wherein the copper foil has a thickness of not more than 35 μm.

14. An article according to claim 7, wherein the copper foil has a thickness of not more than 35 μm.

15. An article according to claim 8, wherein the copper foil has a thickness of not more than 35 μm.

16. An article according to claim 9, wherein the copper foil has a thickness of not more than 35 μm.

* * * * *